(12) United States Patent
Kim et al.

(10) Patent No.: US 11,686,772 B2
(45) Date of Patent: Jun. 27, 2023

(54) SELF DIAGNOSTIC APPARATUS FOR ELECTRONIC DEVICE

(71) Applicant: PhosPhil Inc., Seoul (KR)

(72) Inventors: Byung Kyu Kim, Yongin-si (KR); Byeong Yun Kim, Seoul (KR)

(73) Assignee: PhosPhil Inc., Seoul (KR)

( * ) Notice: Subject to any disclaimer, the term of this patent is extended or adjusted under 35 U.S.C. 154(b) by 68 days.

(21) Appl. No.: 17/496,110

(22) Filed: Oct. 7, 2021

(65) Prior Publication Data

US 2022/0137130 A1  May 5, 2022

(30) Foreign Application Priority Data

Oct. 29, 2020 (KR) .......................... 10-2020-0141801

(51) Int. Cl.
| | | |
|---|---|---|
| *G01R 31/319* | (2006.01) | |
| *G01R 31/28* | (2006.01) | |
| *G01R 31/3185* | (2006.01) | |
| *G01R 31/327* | (2006.01) | |
| *G01R 31/3181* | (2006.01) | |
| *G01R 31/3187* | (2006.01) | |

(52) U.S. Cl.
CPC ... *G01R 31/31905* (2013.01); *G01R 31/2891* (2013.01); *G01R 31/3181* (2013.01); *G01R 31/3187* (2013.01); *G01R 31/31917* (2013.01); *G01R 31/318566* (2013.01); *G01R 31/3274* (2013.01)

(58) Field of Classification Search
CPC .......... G01R 31/31905; G01R 31/2891; G01R 31/318566; G01R 31/31917; G01R 31/3274; G01R 31/3181; G01R 31/3187; G01R 31/00; G01R 31/52; G01K 13/00
See application file for complete search history.

(56) References Cited

U.S. PATENT DOCUMENTS

| | | | |
|---|---|---|---|
| 10,620,266 B2 | 4/2020 | Shanbhogue et al. ...................... G01R 31/3187 |
| 10,970,444 B1* | 4/2021 | Bingham ................. G06F 30/33 |
| 2002/0073374 A1* | 6/2002 | Danialy ........... G01R 31/31724 714/738 |
| 2015/0198663 A1* | 7/2015 | Syed .................. G01R 31/3177 714/726 |

FOREIGN PATENT DOCUMENTS

| | | |
|---|---|---|
| JP | 2003-536083 A | 12/2003 |
| JP | 2004-522167 A | 7/2004 |

(Continued)

OTHER PUBLICATIONS

S. Sunterand P. Sarson, "A/MS benchmark circuits for comparing fault simulation, DFT, and test generation methods," 2017 IEEE International Test Conference (ITC), Fort Worth, TX, USA, 2017, pp. 1-7. (Year: 2017).*

(Continued)

*Primary Examiner* — Cynthia Britt
(74) *Attorney, Agent, or Firm* — Stein IP, LLC

(57) ABSTRACT

The present invention relates to a self-diagnostic apparatus capable of improving safety of a device under test (DUT) by analyzing a characteristic change of a DUT, such as a semiconductor, a circuit module, or a system, in a safe operating region over time and allowing a regular test and a periodic test to be performed even while the DUT is running.

11 Claims, 8 Drawing Sheets

(56) References Cited

FOREIGN PATENT DOCUMENTS

| | | |
|---|---|---|
| JP | 2006-313162 A | 11/2006 |
| JP | 2013-253840 A | 12/2013 |
| JP | 2016-138799 A | 8/2016 |
| JP | 2016-537619 A | 12/2016 |
| KR | 10-2001-0020427 A | 3/2001 |
| KR | 10-2011-0070743 A | 6/2011 |
| KR | 10-2013-0099507 A | 9/2013 |
| KR | 10-2015-0093085 A | 8/2015 |
| KR | 10-1924119 B1 | 11/2018 |

OTHER PUBLICATIONS

J. Wang et al., "Efficient Design-for-Test Approach for Networks-on-Chip," in IEEE Transactions on Computers, vol. 68, No. 2, pp. 198-213, Feb. 1, 2019. (Year: 2019).*
Notice of Allowance dated Mar. 16, 2022, issued corresponding Korean Application No. 10-2020-0141801.

* cited by examiner

200

SELF DIAGNOSTIC APPARATUS FOR ELECTRONIC DEVICE

CROSS-REFERENCE TO RELATED APPLICATIONS

This application claims the benefit of Korean Application No. 10-2020-0141801, filed Oct. 29, 2020, in the Korean Intellectual Property Office. All disclosures of the document named above are incorporated herein by reference.

BACKGROUND

1. Technical Field

The present invention relates to a self diagnostic apparatus for an electronic device. More particularly, the present invention relates to a test technology capable of improving safety of a device under test (DUT) by analyzing a characteristic change of a DUT, such as a semiconductor, a circuit module, or a system, in a safe operating region over time and allowing a regular test and a periodic test to be performed even while the DUT is running unlike the related art.

2. Description of Related Art

In general, for functional safety of a mobile system equipped with an electric and electronic circuit, ISO 26262 defines a standard to secure high safety at a level of automotive safety integrity level (ASIL) 4.

In order to achieve such a high safety goal, it is necessary to have a test circuit capable of performing self-diagnosis in the field.

FIG. 1 is a diagram illustrating a configuration of a device of U.S. Pat. No. 10,620,266 B2 according to the related art, and FIGS. 2 and 3 are diagrams for describing operations according to the related art.

Referring to FIGS. 1 to 3, according to the related art, a device having a plurality of cores includes a self-diagnosis control circuit, and at least one core stores a current arithmetic operation state in a memory according to an external test instruction at the site of use and controls to enter a diagnostic sleep mode.

According to the related art, since a process of stopping an arithmetic operation circuit of the core and restoring the arithmetic operation circuit thereof after testing is required in a process of entering a test mode, and a passive method of performing a test by receiving a test mode entry instruction from the outside is employed, there is a problem in that operating efficiency of a system is lowered.

In addition, the related art has a problem of being not applied to a system requiring high safety because it is not possible to know degradation in function of the circuit and a variation in quality due to time change.

PRIOR-ART DOCUMENTS

Patent Document (Patent Document 1) U.S. Pat. No. 10,620,266 B2 (registered date: Apr. 14, 2020, entitled "SYSTEM, APPARATUS AND METHOD FOR IN-FIELD SELF TESTING IN A DIAGNOSTIC SLEEP STATE")

SUMMARY

1. Technical Problem

A technical objective of the present invention is to have a device configured to confirm a safe operating region of a device under test (DUT), such as a semiconductor device, an information and communications technology (ICT) module, or a system, and to analyze a characteristic change of the safe operating region over time, thereby improving safety of a moving object equipped with an electric and electronic circuit. Another technical objective of the present invention is to allow a regular test and a periodic test to be performed even while a DUT is running, thereby providing a particularly effective solution for a test of electronic devices mounted on moving objects such as autonomous vehicles or drones.

2. Solution to Problem

A self diagnostic apparatus for an electronic device according to the present invention includes: a vector memory configured to store a test function code for testing a device under test (DUT) equipped with a plurality of cores which perform arithmetic operations, a function test expected value corresponding to a function test according to the test function code, a design for test (DFT) test code, a DFT test expected value corresponding to a DFT test according to the DFT test code, and a non-test function code for a general arithmetic operation or an operation of the DUT; a test data storage configured to store test data including a DFT test code result value which is the result of the DFT test according to the DFT test code, a test function code result value which is the result of the function test according to the test function code, and a non-test function code result value which is the result of the function test according to the non-test function code; and a safety region test controller configured to select one among the test function code, the DFT test code, and the non-test function code to select a test mode, control an environmental variable of a test signal applied to the DUT in response to the selected test mode and test the DUT, compare the function test expected value stored in the vector memory with the test function code result value stored in the test data storage, and compare the DFT test expected value stored in the vector memory with the DFT test code result value stored in the test data storage to output comparison result information.

In the self diagnostic apparatus for an electronic device according to the present invention, the safety region test controller may control to periodically assign a partial section of an operation section, which is present between a boot section in which the DUT is booted and a termination section in which the operation of the DUT is terminated, to a section in which a test mode according to the test function code is executed, thereby allowing the test mode according to the test function code to be executed in the operation section.

In the self diagnostic apparatus for an electronic device according to the present invention, the safety region test controller may control a test function code result value, which is obtained in the test mode according to the test function code by varying environmental variables, such as a voltage, a clock frequency, and a temperature which constitute the test signal applied to the DUT, from a minimum value to a maximum value, to be accumulated in the test data storage, compare the test function code result value accumulated in the test data storage with the function test expected value stored in the vector memory, determine a section in which the test function code operates normally and a section in which the test function code operates abnormally, and output the determination result by including the determination result in the comparison result information.

In the self diagnostic apparatus for an electronic device according to the present invention, the test function code, the DFT test code, the function test expected value, the DFT test expected value, and the non-test function code, which are stored in the vector memory, may be input through an external device.

In the self diagnostic apparatus for an electronic device according to the present invention, the safety region test controller may include a self-test controller configured to set a test environment and a test period with respect to the DUT and output advance warning information according to temporal change information of the test data, a test mode selector configured to select a test mode with respect to the DUT, a voltage controller configured to control a voltage applied to the DUT according to the test mode selected by the test mode selector, a clock controller configured to control a clock applied to the DUT according to the test mode selected by the test mode selector, a data comparator configured to compare the function test expected value stored in the vector memory with the test function code result value stored in the test data storage and compare the DFT test expected value stored in the vector memory with the DFT test code result value stored in the test data storage, and a network interface configured to support a network connection with an external device.

In the self diagnostic apparatus for an electronic device according to the present invention, the safety region test controller may further include a voltage register configured to store voltage environment variables including minimum and maximum values of the voltage applied to the DUT by the voltage controller, and step values, that is, unit voltage change values in a case of gradually increasing the voltage from the minimum value to the maximum value, a case of gradually decreasing the voltage from the maximum value to the minimum value, and a case of binary searching a boundary line between a malfunction voltage section and an operating voltage section. In the self diagnostic apparatus for an electronic device according to the present invention, the safety region test controller may further include a clock register configured to store clock environment variables including minimum and maximum values of a frequency of the clock applied to the DUT by the clock controller, step values, that is, unit frequency change values and minimum and maximum delay values of the clock, step values, that is, unit delay change values and minimum and maximum values of a duty ratio of the clock in a case of increasing a delay value of the clock from the minimum delay value to the maximum delay value, a case of decreasing the delay value of the clock from the maximum delay value to the minimum delay value, and a case of binary searching a boundary line between a malfunction delay section and an operation delay section, and step values, that is, unit duty ratio change values in a case of increasing a duty ratio of the clock from a minimum value of a duty ratio to a maximum value thereof, a case of decreasing a duty ratio of the clock from the maximum value to the minimum value, and a case of binary searching a boundary line between a malfunction duty ratio section and an operation duty ratio section.

In the self diagnostic apparatus for an electronic device according to the present invention, the safety region test controller may further include a temperature controller configured to control a temperature of the DUT according to the test mode selected by the test mode selector, and a temperature register configured to store temperature environment variables including a temperature value and a cooling fan drive value for controlling or suspending a process of testing the DUT in response to an amount of heat generated in the DUT in the process of testing the DUT.

In the self diagnostic apparatus for an electronic device according to the present invention, the safety region test controller may further include a temperature detector configured to detect a temperature of the DUT to transmit the detected temperature to the self-test controller in the process of testing the DUT.

In the self diagnostic apparatus for an electronic device according to the present invention, the safety region test controller may further include a current-voltage detector configured to measure a leakage current of an input/output terminal or a power terminal of the DUT to transmit the leakage current to the self-test controller before and after the process of testing the DUT.

In the self diagnostic apparatus for an electronic device according to the present invention, the DUT may include an electronic device mounted on a moving object including an autonomous vehicle or drone, an electronic circuit formed of an information and communications technology (ICT) element including a semiconductor or a display, or an electronic device mounted on a test device.

3. Advantageous Effects

According to the present invention, there is an effect of being capable of searching for safe operation regions of semiconductors, circuit modules, and electrical and electronic devices and autonomously testing and monitoring degradation in function of a circuit over time.

In addition, unlike the conventional method, even when a device under test (DUT) is driven, there is an effect of being capable of performing real-time characteristic diagnosis of a test target, such as an ordinary test and time change analysis.

In addition, due to these advantages, it is possible to confirm degradation in function of the circuit and a change in quality over time so that there is an effect of being applicable to electric and electronic circuits and systems, which require high safety, including moving objects such as autonomous vehicles and drones.

DETAILED DESCRIPTION OF EMBODIMENTS

Specific structural and functional descriptions of embodiments of the present invention disclosed herein are illustrative only for the purpose of describing the embodiments according to the concept of the present invention, and these embodiments according to the concept of the present invention may be implemented in various forms and should not be construed as being limited to embodiments described herein.

The embodiments according to the concept of the present invention may be variously modified and may have various forms so that these embodiments will be illustrated in the accompanying drawings and be described in detail herein. It should be understood, however, that it is not intended to limit the embodiments according to the concept of the present invention to specific disclosure forms but includes all modifications, equivalents, and substitutions falling within the spirit and scope of the present invention.

Unless otherwise defined, all terms including technical or scientific terms used herein have the same meaning as commonly understood by those skilled in the art to which the present invention pertains. General terms that are defined in a dictionary shall be construed to have meanings that are consistent in the context of the relevant art and will not be interpreted as having an idealistic or excessively formalistic meaning unless clearly defined in this disclosure.

Hereinafter, exemplary embodiments of the present invention will be described in detail with reference to the accompanying drawings.

Figure 1:
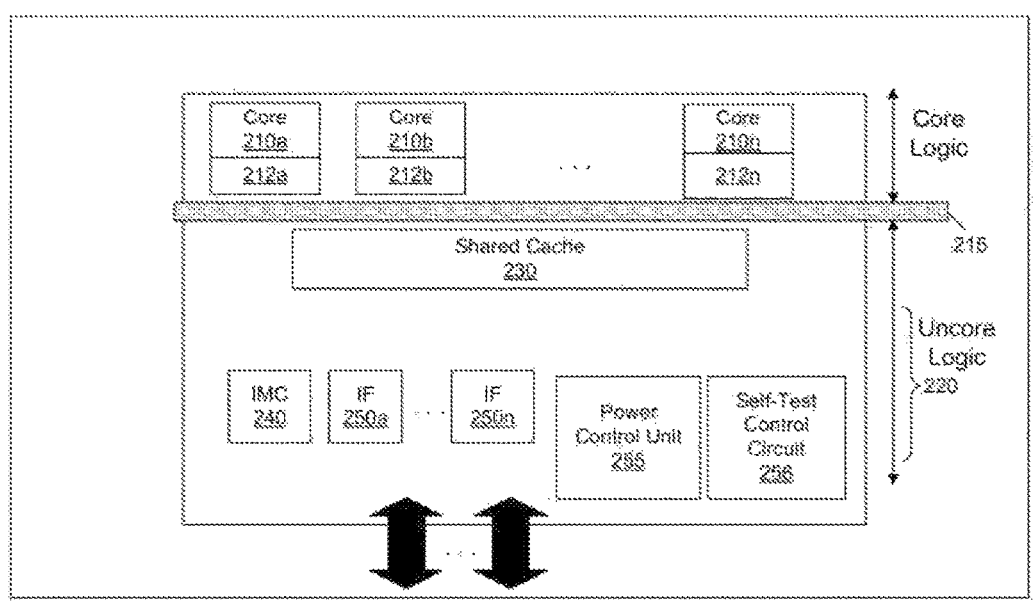
FIG. 1 is a diagram illustrating a configuration of a device according to a related art.
Figure 2:
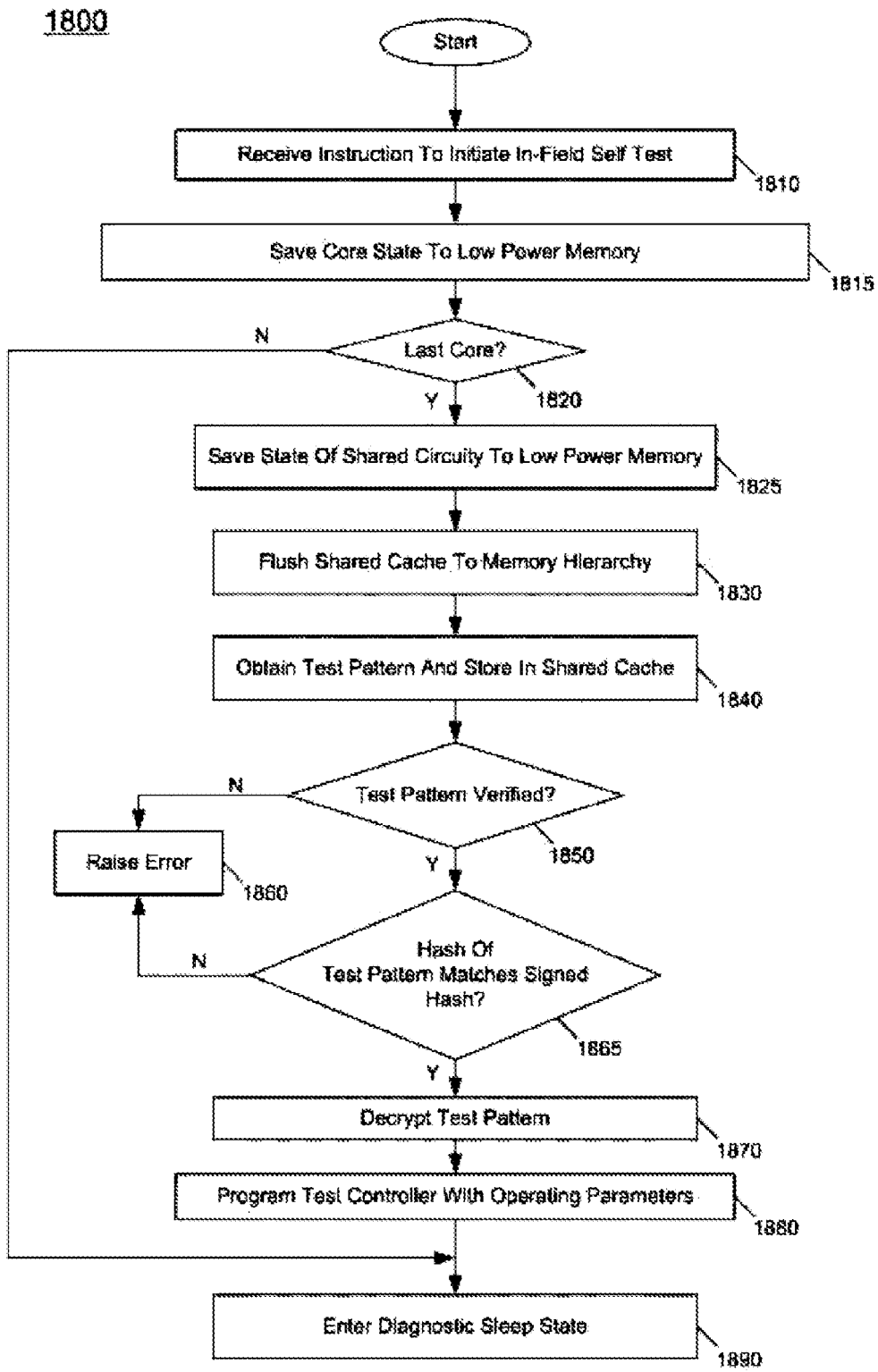
FIGS. 2 and 3 are diagrams for describing operations according to the related art.
Figure 3:
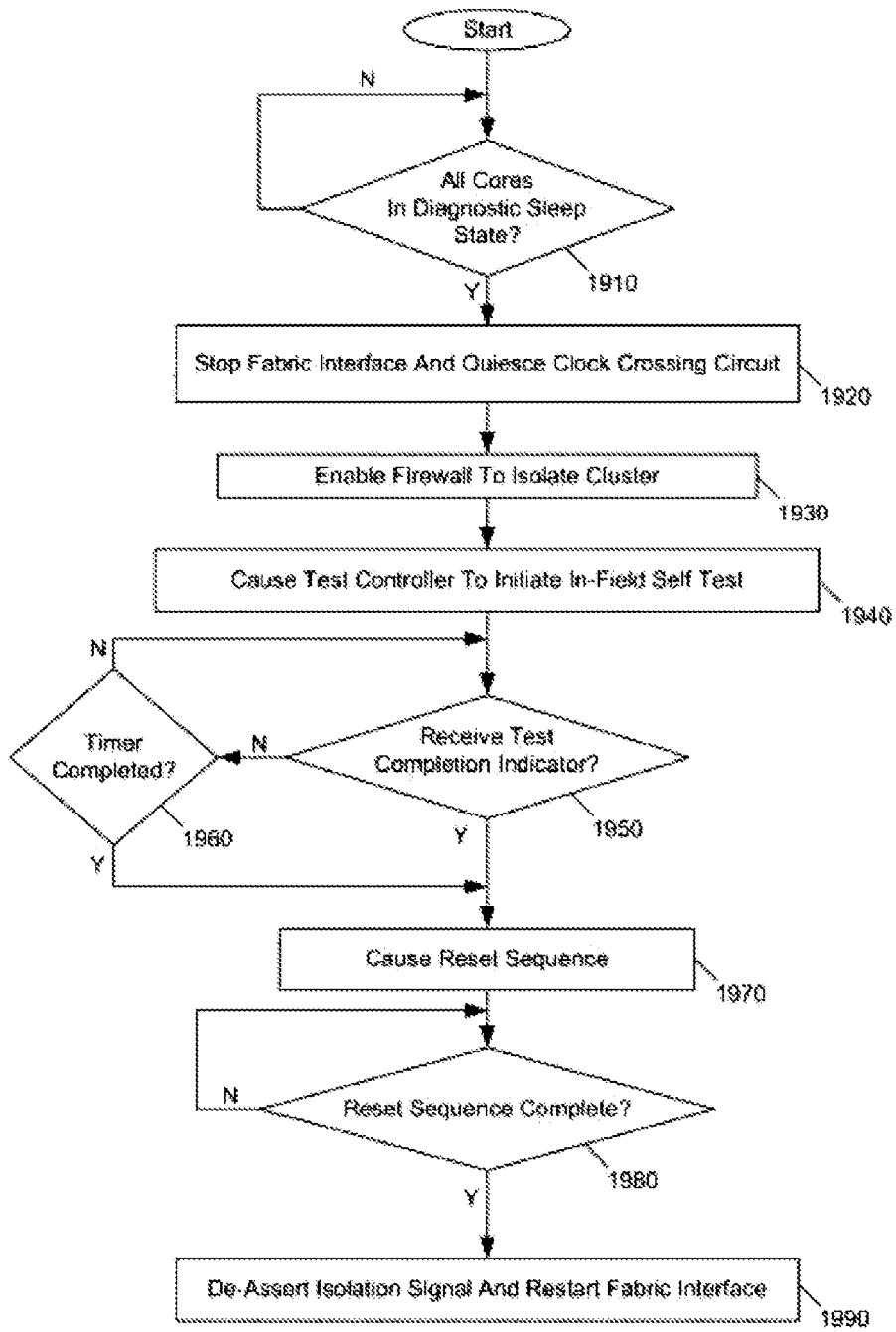
Figure 4:
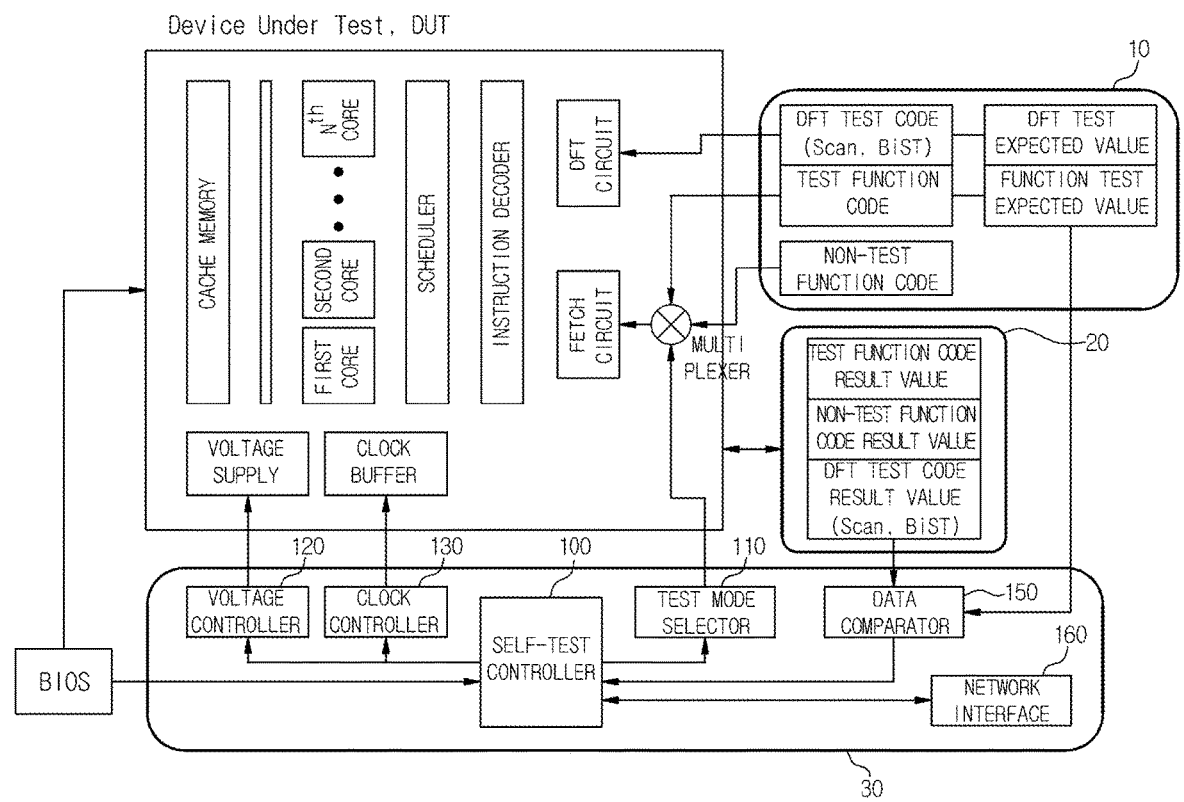
FIG. 4 is a diagram illustrating a self diagnostic apparatus for an electronic device according to one embodiment of the present invention.
Figure 5:
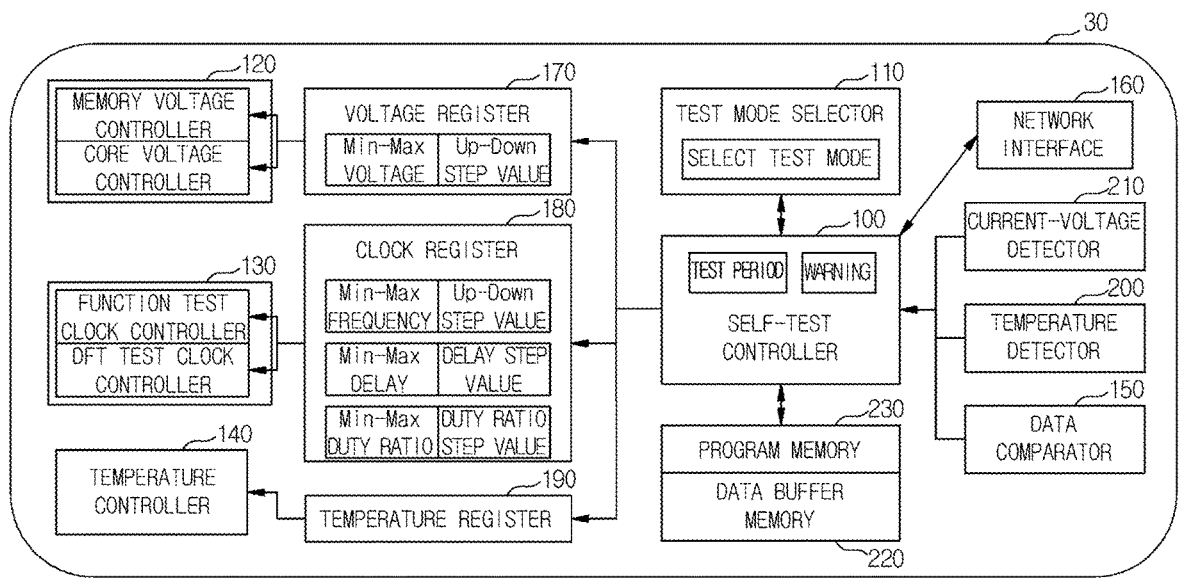
FIG. 5 is a diagram illustrating an exemplary configuration of a safety region test controller according to one embodiment of the present invention.

FIG. 4 is a diagram illustrating a self diagnostic apparatus for an electronic device according to one embodiment of the present invention, and FIG. 5 is a diagram illustrating an exemplary configuration of a safety region test controller 30 according to one embodiment of the present invention.

Referring to FIGS. 4 and 5, the self diagnostic apparatus for an electronic device according to one embodiment of the present invention includes a vector memory 10, a test data storage 20, and the safety region test controller 30.

The vector memory 10 is a component in which a test function code for testing a test target equipped with a plurality of cores which perform arithmetic operations, a function test expected value corresponding to a function test according to the test function code, a design for test (DFT) test code, a DFT test expected value corresponding to a DFT test according to the DFT test code, and a non-test function code for a general arithmetic operation or an operation of a device under test (DUT) are stored.

More specifically, the vector memory 10 may be divided into a non-test code region and a test code region. The non-test code region stores a non-test function code for the general arithmetic operation or the operation of test target, and the test code region includes a test function code, and a DFT test code stores a test expected value corresponding to each code.

Here, the DFT test code includes a scan code for driving SCAN chains constituting a logic unit connection network of an internal circuit of the DUT and a built-in-self-test (BIST) code for driving a BIST circuit for a self-test of an internal cell array. The DFT test code may be configured in a format different from a format of the test function code and operated as a separate channel.

Meanwhile, the test function code may be configured to have the same format as the non-test function code and transmitted and controlled through the same instruction decoder and the same scheduler channel. The test function code is formed to drive a core and a periphery of the DUT in as many regions as possible for a short period of time to allow an efficient test to be performed.

For example, the DUT may be an electronic device mounted on a moving object including an autonomous vehicle or a drone, and the test function code, the DFT test code, the function test expected value, the DFT test expected value, and the non-test function code may be configured to be input and re-entered through an external device.

The test data storage 20 is a component for storing test data including a DFT test code result value which is the result of the DFT test according to the DFT test code, a test function code result value which is the result of the function test according to the test function code, and a non-test function code result value which is the result of the function test according to the non-test function code.

The safety region test controller 30 is a component for selecting one among the test function code, the DFT test code, and the non-test function code to select a test mode, controlling an environmental variable of a test signal applied to the DUT in response to the selected test mode and testing the DUT, comparing the function test expected value stored in the vector memory 10 with the test function code result value stored in the test data storage 20, and comparing the DFT test expected value stored in the vector memory 10 with the DFT test code result value stored in the test data storage 20 to output comparison result information.

The safety region test controller 30 may include a part for controlling a voltage and a frequency which are applied to the DUT, a part for selecting the test code, and a part for comparing an actual test result with an expected value stored in the vector memory 10. A specific configuration of the safety region test controller 30 will be described below.

For example, the safety region test controller 30 may periodically assign a partial section of an operation section, which is present between a boot section in which the DUT is booted and a termination section in which the operation of the DUT is terminated, to a section in which a test mode according to the test function code is executed, thereby controlling the test mode according to the test function code to be executed in the operation section.

In addition, for example, the safety region test controller 30 may be formed to control a test function code result value, which is obtained in the test mode according to the test function code by varying environmental variables, such as a voltage, a clock frequency, and a temperature which constitute the test signal applied to the DUT, from a minimum value to a maximum value, to be accumulated in the test data storage 20, compare the test function code result value accumulated in the test data storage 20 with the function test expected value stored in the vector memory 10, determine a section in which the test function code operates normally and a section in which the test function code operates abnormally, and output the determination result by including the determination result in the comparison result information.

Hereinafter, a specific configuration of the safety region test controller 30 will be additionally described with reference to FIG. 4.

Referring to FIG. 4 additionally, the safety region test controller 30 includes a self-test controller 100, a test mode selector 110, a voltage controller 120, a clock controller 130, a temperature controller 140, a data comparator 150, a network interface 160, a voltage register 170, a clock register 180, a temperature register 190, a temperature detector 200, a current-voltage detector 210, a data buffer memory 220, and a program memory 230.

The self-test controller 100 performs a function of setting a test environment and a test period with respect to the DUT and a function of outputting advance warning information according to temporal variation information of test data with reference to information output from the data comparator 150.

The test mode selector 110 selects a test code to be applied to the DUT to perform the function of selecting the test mode with respect to the DUT.

The voltage controller 120 performs a function of controlling a voltage applied to the DUT according to the test mode selected by the test mode selector 110.

The voltage register 170 stores voltage environment variables including minimum and maximum values of the voltage applied to the DUT by the voltage controller 120, and step values, that is, unit voltage change values in a case of gradually increasing the voltage from the minimum value to the maximum value, a case of gradually decreasing the voltage from the maximum value to the minimum value, and a case of binary searching a boundary line between a malfunction voltage section and an operating voltage section. The binary search has an additional effect of shortening a test time. The clock controller 130 performs a function of controlling a clock applied to the DUT according to the test mode selected by the test mode selector 110.

The clock register 180 stores clock environment variables including minimum and maximum values of a frequency of the clock applied to the DUT by the clock controller 130, step values, that is, unit frequency change values and minimum and maximum delay values of the clock, step values, that is, unit delay change values and minimum and maximum values of a duty ratio of the clock in a case of increasing a delay value of the clock from the minimum delay value to the maximum delay value, a case of decreasing the delay value of the clock from the maximum delay value to the minimum delay value, and a case of binary searching a boundary line between a malfunction delay section and an operation delay section, and step values, that is, unit duty ratio change values in a case of increasing a duty ratio of the clock from a minimum value of a duty ratio to a maximum value thereof, a case of decreasing a duty ratio of the clock from the maximum value to the minimum value, and a case of binary searching a boundary line between a malfunction duty ratio section and an operation duty ratio section.

The temperature controller 140 performs a function of controlling temperatures of components (e.g., a core, a memory, and a board) constituting the DUT according to the test mode selected by the test mode selector 110.

The temperature register 190 stores temperature environment variables including a temperature value and a cooling fan drive value for controlling or suspending the process of testing the DUT in response to an amount of heat generated in the DUT in the process of testing the DUT.

The data comparator 150 performs a function of comparing the function test expected value stored in the vector memory 10 with the test function code result value stored in the test data storage 20 and a function of comparing the DFT test expected value stored in the vector memory 10 and the DFT test code result value stored in the test data storage 20.

The network interface 160 performs a function of supporting a network connection with external devices.

The temperature detector 200 detects a temperature of the components constituting the DUT to transmit the detected temperature to the self-test controller 100 in the process of testing the DUT.

The current-voltage detector 210 measures a leakage current of an input/output terminal or a power terminal of the DUT to transmit the leakage current to the self-test controller 100 before and after the process of testing the DUT.

The data buffer memory 220 stores data relating to the test, and the program memory 230 stores a program used in the test.

Figure 6:
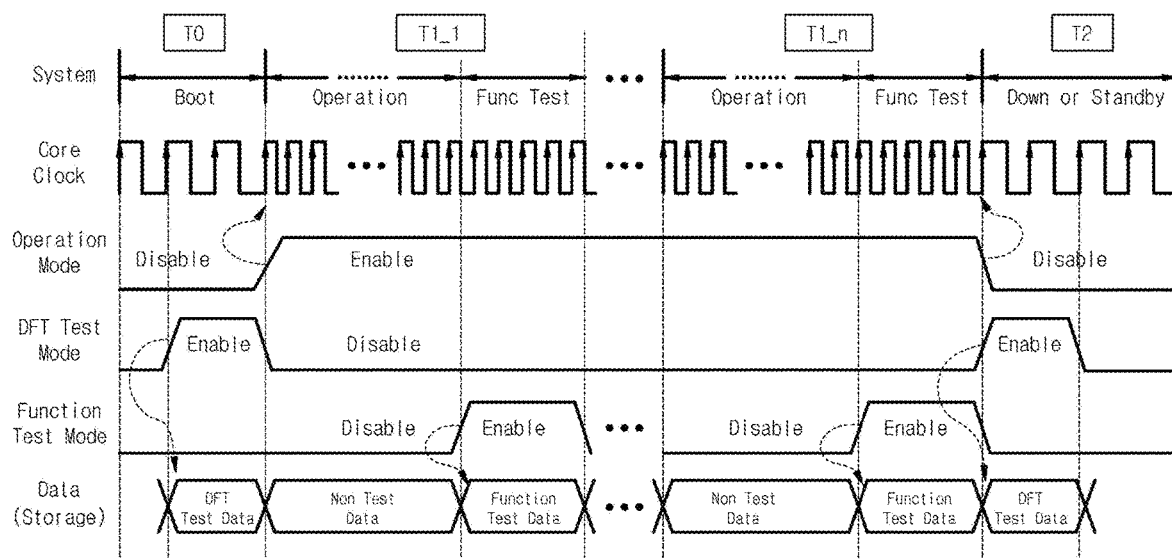
FIG. 6 is a diagram illustrating an exemplary operation timing diagram of the self diagnostic apparatus for an electronic device according to one embodiment of the present invention.

FIG. 6 is a diagram illustrating an exemplary operation timing diagram of the self diagnostic apparatus for an electronic device according to one embodiment of the present invention.

In FIG. 6, a system is the DUT, and a basic operation includes a boot section T0 which is an initial value setting operation, an operation/function test sections T1_1 to T1_$n$ in which tasks are performed, and an end section T2.

In the boot section T0, a DFT check mode is executed subsequent to the initial value setting operation of the system, and a test is performed on a DFT circuit of the system. When the test of the DFT circuit is terminated, the test result is stored in a DFT test data storage region of the test data storage 20.

In the operation/function test section T1, a task of an application program is performed, and the function test mode is executed at a regular interval. In the function test mode, values of environmental variables including a voltage, a frequency, and a temperature are changed from a minimum value to a maximum value to find a section in which the function test code operates normally and a section in which the function test code operates abnormally. The function test is performed periodically and repeatedly, and the function test result is stored in the function code test data storage region of the test data storage 20.

In a method of implementing the function test mode, in addition to the method of performing the function test at a regular period as in the above example, it is also possible to implement a setting for executing the function test mode when a task of the system is terminated due to the application program and thus the system enters an idle state.

In the end section T2, before the system enters a final standby state or a down state, the system enters the DFT test mode to test the DFT circuit of the system. When the test of the DFT circuit is terminated, the test result is stored in the DFT test data storage region of the test data storage 20.

Additionally, since the DFT circuit is designed to operate at a low speed for the purpose of only confirming whether a circuit is connected without directly affecting an operation of a functional circuit, the DFT circuit is not generally affected much by the environment variables and has no relation to functions including a speed down and an abnormal timing of the system. Thus, here, it is not necessary to set for searching a safe operation region in the operation/function test section T1.

Figure 7:
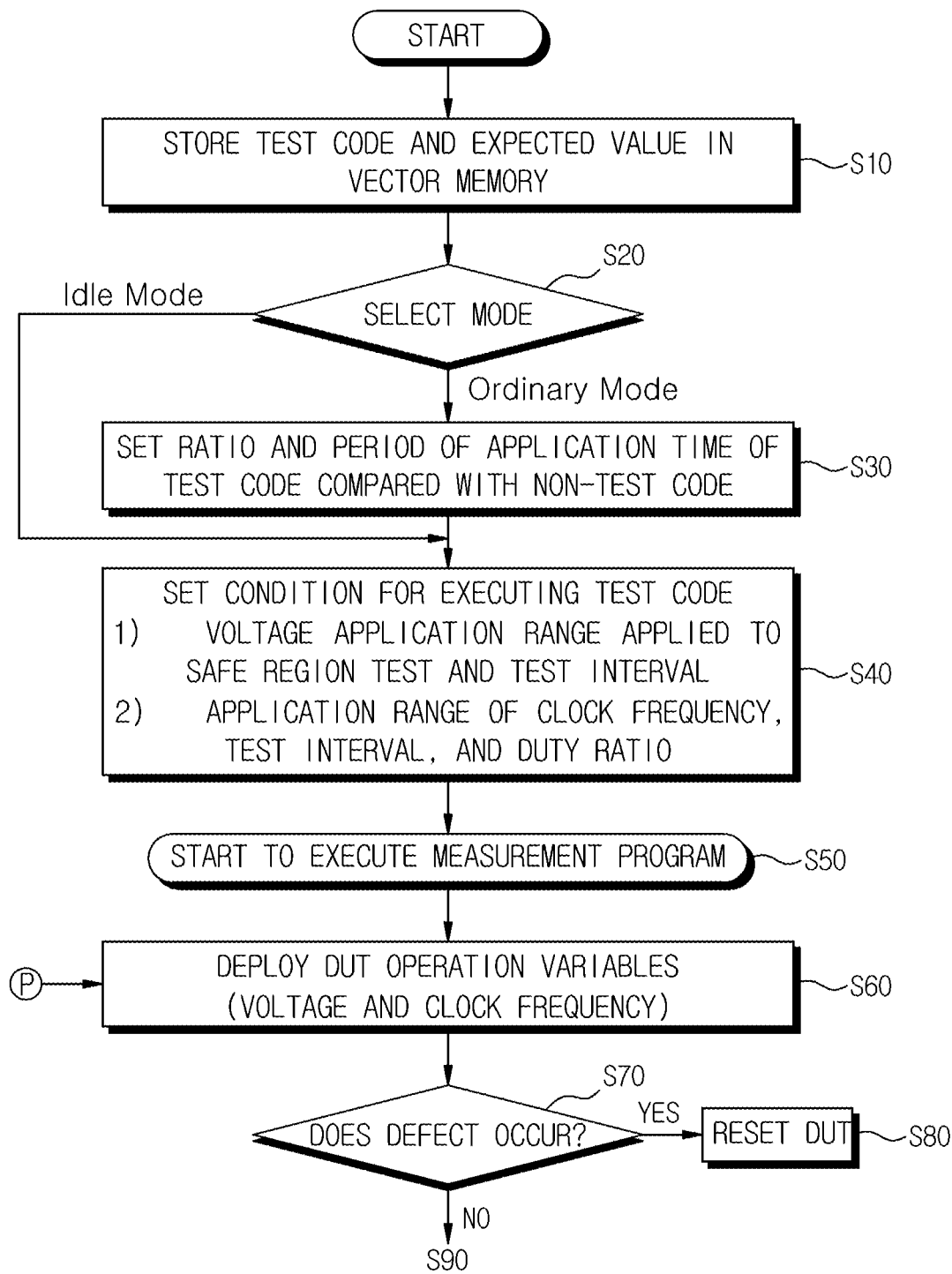
FIGS. 7 and 8 are diagrams for describing an exemplary operation of a self diagnostic apparatus for an electronic device according to one embodiment of the present invention.
Figure 8:
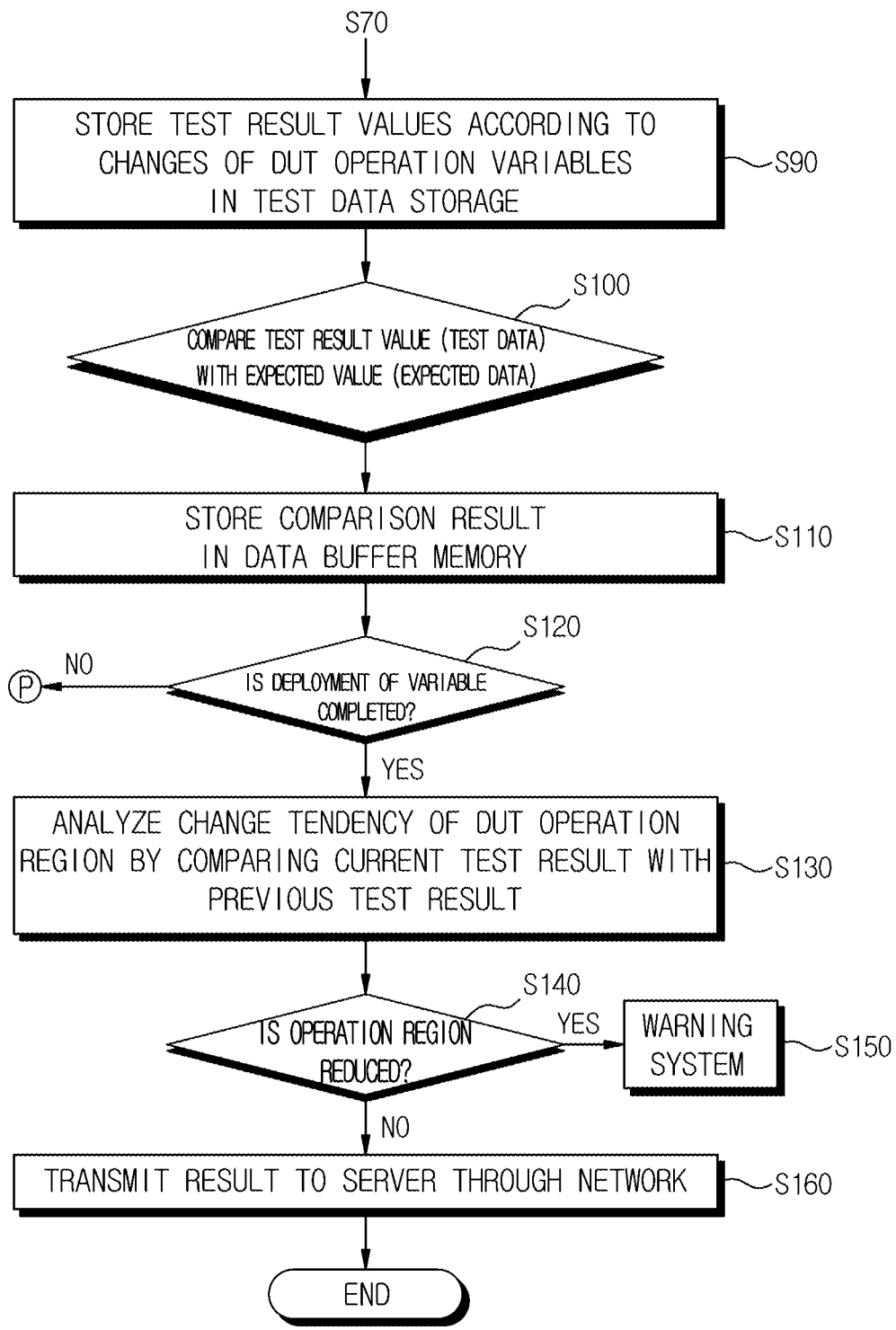

FIGS. 7 and 8 are diagrams for describing an exemplary operation of a self diagnostic apparatus for an electronic device according to one embodiment of the present invention that show a task flow for searching a safe operation region of the DUT. Referring to FIGS. 7 and 8 additionally, first, in operation S10, a process of storing the test code and the expected value, which are transmitted through the network, in the vector memory 10 is performed.

In operation S20, a process of selecting whether to apply the test in an idle state of the DUT or in an ordinary mode thereof is performed. Here, when the idle mode is selected, the test is performed only when the DUT is in the idle state without a task to be performed, and when the ordinary mode is selected, the procedure switches to operation S30 and sets a test code application period for periodically activating the test mode.

In operation S40, a voltage, a frequency, an application range of a clock duty ratio, and a test interval for executing the test code are set, and this setting may be automatically set according to a program input in the system in advance or a value corrected through the network.

In operation S50, when the setting of the environmental variables is completed, a measurement program for the safe operation region is executed.

In operation S70, the operation variable of the DUT is deployed from a minimum value to a maximum value according to a predetermined step and the test is performed, and In operation S90, the test result is stored in the test data storage 20.

In operations S100 and S110, the data comparator 150 compares the test result with the expected value stored in the vector memory 10 to determine whether a defect occurs, and the determination result is stored in the data buffer memory 220 inside the safety region test controller 30.

Here, when a defect occurs during the deployment of the input variable with respect to the DUT, the procedure switches to operation S80 to reset the DUT and deploys the next input variable to continue the test.

In operation S120, it is determined whether the deployment of the operation variable is completed. When the deployment of the operation variable is not completed, the procedure switches to operation S60, and when the deployment of the operation variable is completed, the procedure switches to operation S130.

When the deployment of the operation variable is completed, whether the safe operation region is changed is analyzed when compared with the data previously recorded in operation S130, and when a change in the safe operation region is detected in operation S140, the detected result is transmitted to a warning system in operation S150 or is transmitted to the outside through the network in operation S160. As described in detail above, according to the present invention, there is an effect of being capable of searching for safe operation regions of semiconductors, circuit modules, and electrical and electronic devices and autonomously testing and monitoring degradation in function of a circuit over time.

In addition, unlike the conventional method, even when the DUT is driven, there is an effect of being capable of performing real-time characteristic diagnosis of the DUT, such as an ordinary test and time change analysis.

In addition, due to these advantages, it is possible to confirm degradation in function of the circuit and a change in quality over time so that there is an effect of being applicable to electric and electronic circuits and systems, which require high safety, including moving objects such as autonomous vehicles and drones.

DESCRIPTION OF SYMBOLS

10: vector memory
20: test data storage
30: safety region test controller
100: self-test controller
110: test mode selector
120: voltage controller
130: clock controller
140: temperature controller
150: data comparator
160: network interface
170: voltage register
180: clock register
190: temperature register
200: temperature detector
210: current-voltage detector
220: data buffer memory
230: program memory

The invention claimed is:

1. A self diagnostic apparatus for an electronic device, comprising:
a vector memory configured to store a test function code for testing a device under test (DUT) equipped with a plurality of cores which perform arithmetic operations, a function test expected value corresponding to a function test according to the test function code, a design for test (DFT) test code, a DFT test expected value corresponding to a DFT test according to the DFT test code, and a non-test function code for a general arithmetic operation or an operation of the DUT;
a test data storage configured to store test data including a DFT test code result value which is a result of the DFT test according to the DFT test code, a test function code result value which is a result of the function test according to the test function code, and a non-test function code result value which is a result of the function test according to the non-test function code; and
a safety region test controller configured to select one among the test function code, the DFT test code, and the non-test function code to select a test mode, control an environmental variable of a test signal applied to the DUT in response to the selected test mode and test the DUT, compare the function test expected value stored in the vector memory with the test function code result value stored in the test data storage, and compare the DFT test expected value stored in the vector memory with the DFT test code result value stored in the test data storage to output comparison result information.

2. The self diagnostic apparatus of claim 1, wherein the safety region test controller periodically assigns a partial section of an operation section, which is present between a boot section in which the DUT is booted and a termination section in which the operation of the DUT is terminated, to a section in which a test mode according to the test function code is executed so as to control the test mode according to the test function code to be executed in the operation section.

3. The self diagnostic apparatus of claim 2, wherein the safety region test controller controls a test function code result value, which is obtained in the test mode according to the test function code by varying environmental variables, such as a voltage, a clock frequency, and a temperature which constitute the test signal applied to the DUT, from a minimum value to a maximum value, to be accumulated in the test data storage, compares the test function code result value accumulated in the test data storage with the function test expected value stored in the vector memory, determines a section in which the test function code operates normally and a section in which the test function code operates abnormally, and outputs the determination result by including the determination result in the comparison result information.

4. The self diagnostic apparatus of claim 2, wherein the safety region test controller includes:
a self-test controller configured to set a test environment and a test period with respect to the DUT and output advance warning information according to temporal change information of the test data;
a test mode selector configured to select the test mode with respect to the DUT;
a voltage controller configured to control a voltage applied to the DUT according to the test mode selected by the test mode selector;
a clock controller configured to control a clock applied to the DUT according to the test mode selected by the test mode selector;

a data comparator configured to compare the function test expected value stored in the vector memory with the test function code result value stored in the test data storage and compare the DFT test expected value stored in the vector memory with the DFT test code result value stored in the test data storage; and a network interface configured to support a network connection with an external device.

5. The self diagnostic apparatus of claim 4, wherein the safety region test controller further includes a voltage register configured to store voltage environment variables including minimum and maximum values of the voltage applied to the DUT by the voltage controller, and step values, that is, unit voltage change values in a case of gradually increasing the voltage from the minimum value to the maximum value, a case of gradually decreasing the voltage from the maximum value to the minimum value, and a case of binary searching a boundary line between a malfunction voltage section and an operating voltage section.

6. The self diagnostic apparatus of claim 4, wherein the safety region test controller further includes a clock register configured to store clock environment variables including minimum and maximum values of a frequency of the clock applied to the DUT by the clock controller, step values, that is, unit frequency change values and minimum and maximum delay values of the clock, step values, that is, unit delay change values and minimum and maximum values of a duty ratio of the clock in a case of increasing a delay value of the clock from the minimum delay value to the maximum delay value, a case of decreasing the delay value of the clock from the maximum delay value to the minimum delay value, and a case of binary searching a boundary line between a malfunction delay section and an operation delay section, and step values, that is, unit duty ratio change values in a case of increasing a duty ratio of the clock from a minimum value of a duty ratio to a maximum value thereof, a case of decreasing a duty ratio of the clock from the maximum value to the minimum value, and a case of binary searching a boundary line between a malfunction duty ratio section and an operation duty ratio section.

7. The self diagnostic apparatus of claim 4, wherein the safety region test controller includes:

a temperature controller configured to control a temperature of the DUT according to the test mode selected by the test mode selector; and a temperature register configured to store temperature environment variables including a temperature value and a cooling fan drive value for controlling or suspending a process of testing the DUT in response to an amount of heat generated in the DUT in the process of testing the DUT.

8. The self diagnostic apparatus of claim 7, wherein the safety region test controller further includes a temperature detector configured to detect a temperature of the DUT to transmit the detected temperature to the self-test controller in the process of testing the DUT.

9. The self diagnostic apparatus of claim 4, wherein the safety region test controller further includes a current-voltage detector configured to measure a leakage current of an input/output terminal or a power terminal of the DUT to transmit the leakage current to the self-test controller before and after the process of testing the DUT.

10. The self diagnostic apparatus of claim 1, wherein the test function code, the DFT test code, the function test expected value, the DFT test expected value, and the non-test function code, which are stored in the vector memory, are allowed to be input through an external device.

11. The self diagnostic apparatus of claim 1, wherein the DUT includes an electronic device mounted on a moving object including an autonomous vehicle or drone, an electronic circuit formed of an information and communications technology (ICT) element including a semiconductor or a display, or an electronic device mounted on a test device.

* * * * *